US006235453B1

(12) United States Patent
You et al.

(10) Patent No.: US 6,235,453 B1
(45) Date of Patent: May 22, 2001

(54) LOW-K PHOTORESIST REMOVAL PROCESS

(75) Inventors: Lu You, Santa Clara; Steven C. Avanzino, Cupertino; Jacques Bertrand, Capitola; Richard J. Huang, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/349,055

(22) Filed: Jul. 7, 1999

(51) Int. Cl.$^7$ ........................................ G03F 7/26
(52) U.S. Cl. ................................ 430/329; 430/316
(58) Field of Search ....................... 430/316, 329

(56) References Cited

U.S. PATENT DOCUMENTS

| | | | |
|---|---|---|---|
| 4,340,456 | * 7/1982 | Robinson et al. | 204/192 E |
| 5,795,831 | 8/1998 | Nakayama et al. | 438/714 |
| 5,908,510 | * 6/1999 | McCullough et al. | 134/2 |
| 5,994,755 | * 11/1999 | DeJong et al. | 257/500 |
| 6,030,901 | 2/2000 | Hopper et al. | 438/711 |

FOREIGN PATENT DOCUMENTS 0 304 068   2/1989   (EP) .
WO 99/31725   6/1999   (WO) .

OTHER PUBLICATIONS

Louis, D. et al: "Post etch cleaning of low–k dielectric materials for advanced interconnects: characterization and process optimization." Microelectronic Engineering, vol. 41–42, Mar. 1998, pp. 415–418, © Elsevier Science B.V., Netherlands, ISSN: 0167–9317.

Nguyen, D. et al.: "A forming gas resist strip process for use with non–etchback low k spin–on polymers." Proceedings Thirteenth International VLSI Multilevel Interconnection Conference (VMIC), Santa Clara, CA, USA, Jun. 18–20, 1996, p. 147, XP000923061.

Form PCT/ISA/220 (Jul. 1998) for PCT International application No. PCT/US 00/ 06603 dated Nov. 13, 2000.

* cited by examiner

*Primary Examiner*—Hoa Van Le
(74) *Attorney, Agent, or Firm*—Foley & Lardner

(57) ABSTRACT

An integrated circuit and a method of removing photoresist is described. The process described uses a low oxygen gas or non-oxygen gas plasma that removes the photoresist and provides a protective surface layer over the low-k dielectric material. The low-k dielectric material is part of a dielectric stack. After exposure to the gas plasmas the integrated circuit is subjected to solvent.

7 Claims, 1 Drawing Sheet

LOW-K PHOTORESIST REMOVAL PROCESS

FIELD OF THE INVENTION

The invention relates to the fabrication of integrated circuits and more particularly to removing photoresist from an integrated circuit by using a non-oxygen gas or low oxygen gas plasma process.

BACKGROUND OF THE INVENTION

In very large scale integrated (VLSI) circuit devices, several wiring or metal layers are required to connect together the active or passive elements in a VLSI semiconductor chip. The interconnection structure consists of thin conductive lines separated by insulation (silicon dioxide) in one layer or level and connected to elements of the semiconductor chip or to a similar layer in another level. Vias or studs extend through the insulation and can be connected to contacts associated with the elements of the semiconductor chip. Connections between levels or layers and between layers and the elements of the semiconductor chip are then made. Conventional ultra-large scale integrated (ULSI) circuit devices can include five or more layers.

The interconnection structure associated with VLSI and ULSI circuits is similar to a transmission line in that there is a propagation delay of the signals being transmitted in these wiring layers. The delay is referred to as RC delay because it generally relates to the resistance (R) of the material of the wire and the capacitance (C) between adjacent wires.

With the trend of higher and higher levels of integration in integrated circuits (ICs), the space or gap (e.g., the thickness between the conductive lines or layers) is becoming extremely narrow, such as about 0.5 microns and smaller. Such a narrow space or gap between conductive lines increases the capacitance and places greater demands on the insulating properties of the insulation between such conductive lines. Capacitance (C) is the product of dielectric constant (k) of the insulating material times the area (A) of the opposing faces of the conductive line divided by the distance (D) between the conductive lines $$\left(C = \frac{kA}{D}\right).$$

With a decrease in distance (D), the capacitance (C) increases. Since signal delay of signals transmitted on the conductive line is controlled by the RC constant, an increase in capacitance (C) degrades the performance of the integrated circuit.

Thus, it is desirable to replace traditional silicon dioxide ($SiO_2$) insulative materials in multi-level interconnect devices with dielectric materials having low dielectric constants (hereinafter referred to as low-k dielectric materials). A disadvantage to using low-k dielectric materials is that traditional photoresist removal processes (e.g., ashing and solvent cleaning) causes degradation of most low-k dielectric materials. For example, photoresist removal on low-k dielectric materials, such as, hydrogen silsesquioxanes (HSQ), spin on glass (SOG), benzocyclobutine (BCB), etc., causes the dielectric constant (k) to increase. Furthermore, the conventional solvent cleaning of the integrated circuit after the ashing process typically causes further degradation of low-k dielectrics and causes increases in dielectric constant k.

Thus, there is a need and desire for a method of producing integrated circuits, including VLSI and ULSI circuits, that maintains the integrity of low-k dielectric materials during the ashing and solvent cleaning process associated with photoresist removal. Further, there is a need and desire for a method of producing integrated circuit devices that uses a non-oxygen gas ($O_2$) or trace $O_2$ forming gas plasma process that creates a protective surface layer and removes photoresist with a relatively high ashing rate. Further still, there is a need and desire for a method of producing an integrated circuit device that uses a high temperature and high vacuum degassing process to remove trace amounts of photoresist and eliminates moisture on the surface of the integrated circuit device while preserving the integrity of the low-k dielectric material.

SUMMARY OF THE INVENTION

The present invention relates to a method of photoresist removal from an integrated circuit wafer. The method includes exposing the wafer to a plasma. The forming gas of the plasma is substantially free of oxygen gas ($O_2$) and removes photoresist from the integrated circuit wafer. The method also includes removing the remaining photoresist from the wafer using a solvent and degassing the integrated circuit wafer.

The present invention also relates to a method of photoresist removal from an integrated circuit wafer. The method includes providing an integrated circuit having a layer of photoresist overlying a dielectric stack. The method also includes placing the integrated circuit in a substantially pure plasma to remove photoresist from the integrated circuit wafer.

The present invention still further relates to an integrated circuit. The integrated circuit includes a dielectric stack having a first insulative layer, a second insulative layer and a third insulative layer, the second insulative layer being a low-k dielectric layer between the first insulative layer and the third insulative layer. A via extends through the dielectric stack and the lateral sides of the second layer of the dielectric stack includes a protective layer.

BRIEF DESCRIPTION OF THE DRAWINGS

The invention will hereafter be described with reference to the accompanying drawings, wherein like reference numerals denote like elements in the various drawings, and.

DETAILED DESCRIPTION OF THE PREFERRED EMBODIMENT

Figure 1:
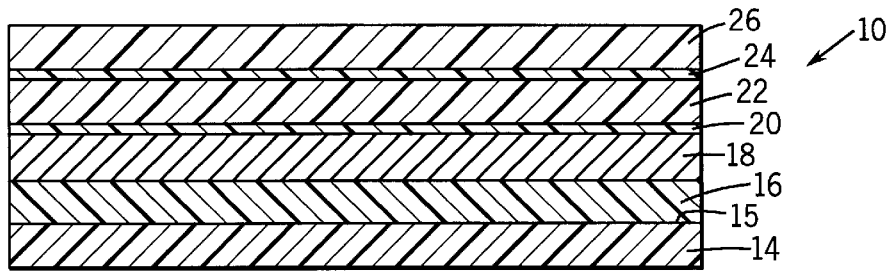
FIG. 1 is a cross sectional view of a portion of an integrated circuit having a top layer of photoresist.

Referring to FIG. 1, a portion of an integrated circuit wafer 10 is depicted. Integrated circuit wafer 10 includes a silicon substrate 14, a low-k dielectric layer 16, a conductive metal layer 18, an oxide layer 20, a low-k dielectric layer 22, an oxide layer 24, and a photoresist layer 26. Silicon substrate 14 is typically a single crystal silicon wafer having a thin layer of silicon dioxide on its outermost surface 15. Alternatively, substrate 14 may be a silicon dioxide ($SiO_2$)

substrate, a gallium arsenide (GaAs) substrate, or other insulating materials.

Low-k dielectric layer 16 is deposited over silicon substrate 14. Low-k dielectric layer 16 is a thin layer of low-k material, having a thickness of approximately 200 Angstroms, or alternatively any suitable thickness. Low-k dielectric layer 16 may be a spin on deposit of materials such as HSQ, SOG, BCB or other suitable materials. The low-k dielectric materials are deposited using spin on deposit techniques in which the materials are dissolved in a solvent and spun on to integrated circuit wafer 10. Alternatively, chemical vapor deposition (CVD) techniques can be used or any other deposition techniques that are known to those of ordinary skill in the art of semiconductor fabrication. After thin layer of low-k dielectric 16 has been deposited over substrate 14, low-k dielectric 16 may be heat cured or in the alternative, low-k dielectric 16 may be electron beam cured or cured by any suitable manner known to those of ordinary skill in the art.

Conductive metal layer 18 is deposited over low-k dielectric layer 16. Conductive layer 18 may be deposits of aluminum (Al), copper (Cu), gold (Au), tungsten (W), or alloys including these metals or polysilicon. Conductive metal layer 18 may be deposited by evaporation methods, such as physical vapor deposition (PVD), sputtering or plating. Evaporation methods use heat and high-vacuums to cause vaporization of a metal source. The vaporized metal material condenses on the cooler wafer surface. Sputtering techniques are well known in the art and use a plasma to bombard a metal source. The dislodged metal molecules are then deposited onto the wafer.

After conductive metal layer 18 is deposited and patterned (when creating a subtractive metal interconnect structure as opposed to the damascene structure depicted in the figures), an optional oxide layer 20 is deposited utilizing for example a tetraethylorthosilane (TEOS) process or other suitable processes known to those of ordinary skill in the art.

Alternatively, silicon dioxide or other suitable materials can be deposited as oxide layer 20.

Low-k dielectric layer 22 is then deposited over oxide layer 20, similar to low-k dielectric layer 16. A cap layer 24 (usually an oxide layer) is then deposited over low-k layer 22, similar to oxide layer 20. Layers 24, 22, and 20 form a dielectric stack. Alternatively, the dielectric stack may be a single insulating layer of low-k dielectric 22 or any suitable combination of dielectric layers.

Photoresist layer 26 is a layer of photoresist or mask material, which is a photo-sensitive material, that is applied over oxide layer 24 in a liquid state in relatively small quantities. The wafer is spun at approximately 3,000 RPMs spreading the photoresist material into a uniform layer, typically between 0.15 and 200 micrometers ($\mu$m) thick. Two types of photoresist may be used, the two types being negative photoresist and positive photoresist.

A negative photoresist causes unexposed portions of the photoresist to be removed leaving a "negative image". Negative photoresist is typically only capable of producing features down to about 2 $\mu$m. Most conventional semiconductor processes today use a positive resist where exposed portions are removed leaving a "positive image" of the masked pattern on the surface of the wafer.

Positive resists are more capable of producing the small size of modern device features which are typically below 1 $\mu$m but may be as small as 0.15 $\mu$m.

Figure 2:
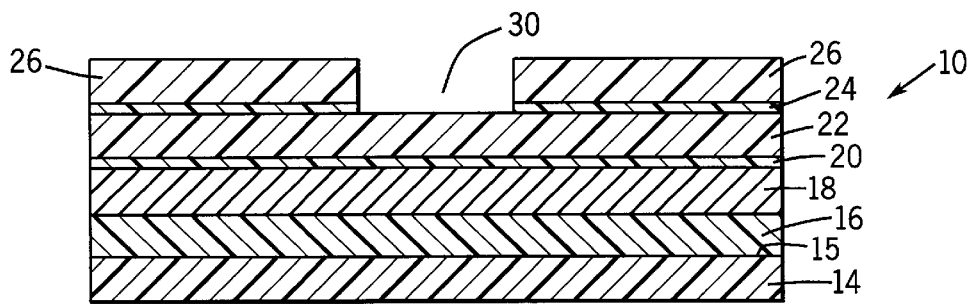
FIG. 2 is a cross sectional view of the integrated circuit of FIG. 1 having some of the photoresist of FIG. 1 selectively removed.

After photoresist layer 26 is deposited on oxide layer 24, photoresist layer 26 is masked. If a positive resist is used, the portions which are not to be removed are masked. The masked wafer is then exposed to high intensity ultra-violet light. The ultra-violet light causes the exposed photoresist to undergo a chemical change, becoming more acidic. Once the wafers have been developed by exposure, the wafers are etched either in an acid or base solution to remove (or strip) the exposed areas of the photoresist. The wafer is then heated at a low temperature which hardens the remaining photoresist 26. With reference to FIG. 2, this developing and stripping procedure leaves a pattern of channels 30 in the photoresist 26.

Figure 3:
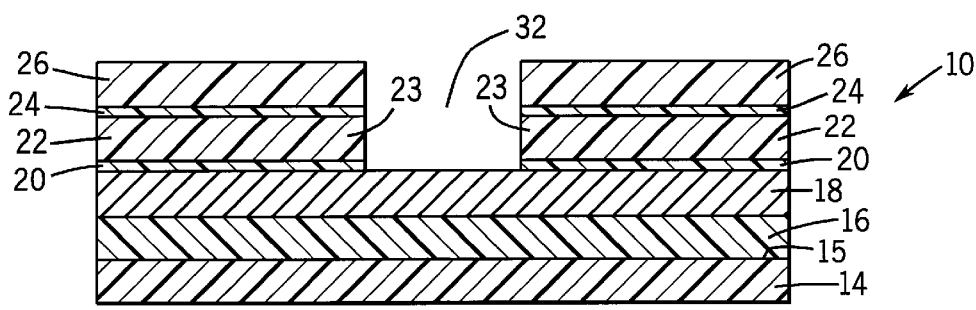
FIG. 3 is a cross sectional view of the dielectric stack illustrated in FIG. 2 having a via etched through the dielectric layers.

After the pattern of channels 30 has been created in the photoresist, an etching process, known to those of ordinary skill in the art, is used to create a via 32 (FIG. 3) through layers 24, 22, and 20. Via 32 can be created by dry etching. Via 32 will be used to create a post contact to interconnect conductive metal layer 18 with another layer of device 10, such as a layer (not shown) above layer 24.

Once layers 20, 22, and 24 have been etched to form via 32, photoresist 26 may be removed. According to the invention, ashing (or photoresist removal) is performed in a non-oxygen gas or trace oxygen forming gas plasma process. Wafer 10 is exposed to a high temperature plasma that selectively removes photoresist 26 without damaging conductive lines 18, oxide layer 20, low-k dielectric layer 22, or oxide layer 24. In a preferred embodiment of the present invention, the plasma used is non-oxygen forming gas plasma. For example, in a preferred embodiment a non-oxygen forming gas plasma may be used that contains up to 20% of combined hydrogen gas ($H_2$) and nitrogen gas ($N_2$). If photoresist layer 26 has a thickness on the order of 1 $\mu$m, wafer 10 should be exposed to the plasma for approximately 4–10 minutes at a temperature of 250–270° C. to complete the photoresist removal. Alternatively, other plasma forming gasses may be used having either no $O_2$ or a trace amount of $O_2$ (less than 5%) and the exposure times and temperatures should be varied accordingly. For instance, plasmas that are suitable for use are plasmas that do not degrade the low-k properties in the dielectric layer. For instance, other plasma forming gasses that may be suitable are $H_2+N_2$+trace $O_2$ forming gasses, water ($H_2O$) vapor forming gasses, and $H_2+N_2+CF_4$ (carbon tetrafluoride) forming gasses, and any other $O_2$-less or low-$O_2$ forming gasses that do not substantially degrade low-k dielectric layer 22 and still provide an adequate ashing rate. Plasmas from forming gasses in this class may be characterized as substantially pure plasmas, i.e., plasmas having an $O_2$ content less than about 5% so that the oxygen does not cause reaction with the low-k dielectric which would substantially raise the k value thereof.

In a preferred embodiment of the present invention, it is also desirable for the plasma to create a protective layer on surface 23 of low-k dielectric material 22. The protective layer is created during exposure of layer 22 to the plasma. Exposure of low-k dielectric layer 22 to the conditions present during plasma ashing causes a physical or chemical change to surface 23 of low-k dielectric 22. This protective layer provides a protective block such that $O_2$ plasma photoresist ashing solvent and photoresist removal solvent does not easily penetrate the protective layer and further degrade the low-k dielectric layer. A thicker protective layer provides better protection from solvent attack of low-k dielectric layer 22. Therefore, low dielectric constants of layer 22 are maintained. If a pure $O_2$ plasma is used to remove photoresist layer 22, the low-k dielectric layer is degraded or removed.

After the photoresist has been removed using a low-$O_2$ or $O_2$-less plasma process, wafer 10 is deposited in a solvent that removes any remaining photoresist from wafer 10. As discussed earlier, exposing low-k dielectric layer 22 to many solvents will cause degradation of low-k dielectric layer 22 and will cause a significant rise in the dielectric constant (k) (as the dielectric constant of water is 85). Therefore, it is desirable to use a photoresist ashing process, as described above, that provides a protective layer over low-k dielectric layer 22 in advance of the solvent cleaning process.

Figure 4:
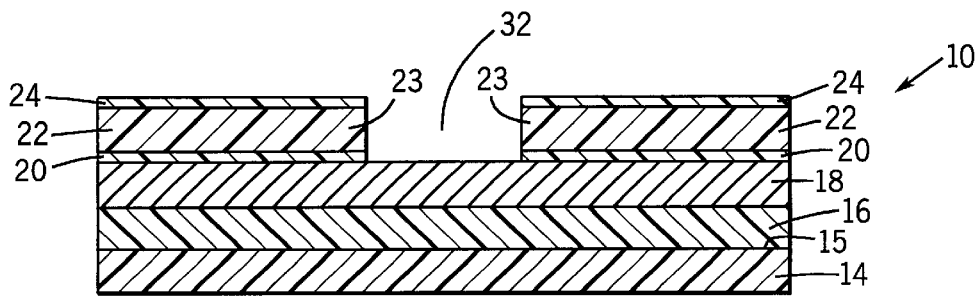
FIG. 4 is a cross sectional view of the integrated circuit of FIG. 3 depicting the integrated circuit with the photoresist removed.

After the cleaning process has removed the majority of remaining photoresist, a degassing process is used to remove any trace photoresist and eliminate any moisture. The degassing process includes placing integrated circuit wafer 10 in a vacuum, such that the solvent and any trace photoresist is evaporated. Furthermore, the degassing process may be accomplished by exposing integrated circuit wafer 10 to high temperature (i.e., heating integrated circuit wafer 10) alone or in combination with exposing integrated circuit wafer 10 to a vacuum. The resulting device 10 is depicted in FIG. 4 having a via 32 extending through insulative layers 24, 22, and 20 and being terminated at conductive metal layer 18, where a post contact may be deposited in a next processing step.

Experimental results have provided an indication of the usefulness and effectiveness of the processes described above. For example, (1) a layer of HSQ having a layer of photoresist removed by exposing wafer 10 to a substantially oxygen free forming gas plasma for four minutes resulted in an effective dielectric constant of approximately 3.00; (2) a layer of HSQ exposed to a solvent used to remove organic and inorganic substances without substantially affecting metallic materials, resulted in an effective dielectric constant of 7.47; and(3) the same HSQ layer as in (1) having a layer of photoresist removed with a substantially oxygen free plasma, followed by the same solvent wash as in (2), resulted in an effective dielectric constant of 3.05. Thus, the solvent wash per (2), that alone degraded the dielectric layer, was protected by physical/chemical changes to the exposed dielectric surface resulting from the application of the substantially oxygen free plasma used to remove photoresist.

Similar effective results may be obtained using the disclosed process, however the above exemplary results should not be considered limiting. A number of different plasmas may be used, having forming gasses that include but are not limited to substantially $O_2$-free, $N_2$ plus approximately 4% $H_2$, low $O_2$ (less than 5% $O_2$), low $O_2$ plus $H_2$ plus approximately 4% $N_2$, and other suitable forming gasses. Furthermore, wafer 10 may be exposed to the plasma for a variety of times, for example, the exposure times may range from about 30 seconds to about ten minutes. Thus, exposure times are dependent on photoresist thickness, plasma composition, plasma temperature, and other controllable and uncontrollable factors. However, one of ordinary skill in the art could easily find a suitable combination of low-$O_2$ or non-$O_2$ plasma and exposure time without undue experimentation. Solvents used in the washing process are well known to those of ordinary skill in the art and all come from a family of solvents that is effective at dissolving organic and inorganic substances without substantially affecting metallic materials. It is well known to those of ordinary skill in the art to use solvents that are compatible with the types of materials that are being removed and those that are intended to be unaffected.

The method and apparatus provide a means to remove photoresist from low-k materials such that the forming gas plasma does not significantly impact the value of the dielectric constant (k). Further, providing trace amounts of $O_2$ in the plasma forming gas increases the ashing rate. Further still, the low $O_2$ or $O_2$-free plasma creates a protective layer to resist solvent attack to the dielectric layers.

It is understood that while the detailed drawings and examples given describe preferred exemplary embodiments of the present invention, they are for the purposes of illustration only. The method and apparatus of the invention is not limited to the precise details and conditions disclosed. For example, it is not limited to the specific plasmas or low-k dielectric materials but only to their specific characteristics such as providing limited low-k dielectric layer degradation and providing the appropriate insulating characteristics respectively. Further, the method and apparatus are not limited to the damascene structure shown, rather the method and apparatus may be applied to a subtractive metal interconnect structure, or any other applicable structures. Various changes may be made to the details disclosed without departing from the spirit of the invention, which is defined by the following claims.

What is claimed is:

1. A method of photoresist removal from a low-k dielectric layer of an integrated circuit wafer, comprising:
    exposing the wafer to a plasma, the plasma having a forming gas substantially free of oxygen, to remove at least a portion of the photoresist from the low-k dielectric layer without causing substantial degradation of the low-k dielectric layer and creating a protective layer;
    removing any remaining portion of the photoresist from the wafer using a solvent; and
    degassing the integrated circuit wafer.

2. The method of photoresist removal of claim 1, wherein the forming gas of the plasma is up to about 20% combined hydrogen gas ($H_2$) and nitrogen gas ($N_2$).

3. The method of photoresist removal of claim 2, wherein the exposing step is carried out for 30 seconds to 10 minutes.

4. The method of photoresist removal of claim 1, wherein the forming gas of the plasma includes hydrogen gas ($H_2$), nitrogen gas ($N_2$), and carbon tetrafluoride ($CF_4$).

5. The method of photoresist removal of claim 1, wherein the photoresist is removed after etching at least one via.

6. The method of photoresist removal of claim 5, wherein a protective layer is created on at least one insulative layer exposed in the at least one via.

7. The method of photoresist removal of claim 1, wherein the photoresist overlies a low-k dielectric layer and the low-k dielectric layer overlies a conductive layer.

* * * * *